(12) United States Patent
Lin et al.

(10) Patent No.: US 10,586,844 B2
(45) Date of Patent: Mar. 10, 2020

(54) INTEGRATED TRENCH CAPACITOR FORMED IN AN EPITAXIAL LAYER

(71) Applicant: Texas Instruments Incorporated, Dallas, TX (US)

(72) Inventors: He Lin, Frisco, TX (US); Jiao Jia, Chengdu (CN); Yunlong Liu, Chengdu (CN); Manoj Jain, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/021,123

(22) Filed: Jun. 28, 2018

(65) Prior Publication Data

US 2019/0229180 A1    Jul. 25, 2019

Related U.S. Application Data

(60) Provisional application No. 62/620,763, filed on Jan. 23, 2018.

(51) Int. Cl.
*H01L 21/02* (2006.01)
*H01L 49/02* (2006.01)
*H01L 23/495* (2006.01)

(52) U.S. Cl.
CPC ........ *H01L 28/40* (2013.01); *H01L 21/02573* (2013.01); *H01L 23/49503* (2013.01); *H01L 23/49589* (2013.01)

(58) Field of Classification Search
CPC .................................................... H01L 28/40
USPC ......................................................... 257/532
See application file for complete search history.

(56) References Cited

U.S. PATENT DOCUMENTS

| 4,763,181 A | 8/1988 | Tasch, Jr. |
| 4,958,206 A | 9/1990 | Teng et al. |
| 5,508,541 A | 4/1996 | Hieda et al. |
| 2005/0028085 A1 | 12/2005 | Irwin et al. |
| 2008/0042208 A1* | 2/2008 | Hshieh .............. H01L 29/66727 257/360 |
| 2008/0291603 A1* | 11/2008 | Matters-Kammerer ..................... H01L 28/90 361/313 |
| 2009/0146760 A1* | 6/2009 | Reefman ............. H01L 23/3107 333/184 |
| 2013/0069198 A1 | 3/2013 | Claeys et al. |
| 2015/0163915 A1* | 6/2015 | Kautzsch ............. H05K 1/0284 361/761 |
| 2015/0380384 A1* | 12/2015 | Williams ................ H01L 24/07 438/112 |

(Continued)

OTHER PUBLICATIONS

PCT Search Report for Application No. PCT/US 2019/014518, dated Apr. 25, 2019.

*Primary Examiner* — Ajay Arora
(74) *Attorney, Agent, or Firm* — Andrew R. Ralston; Charles A. Brill; Frank D. Cimino

(57) ABSTRACT

A trench capacitor includes at least one epitaxial semiconductor surface layer on a semiconductor substrate having a doping level that is less than a doping level of the semiconductor substrate. A plurality of trenches are formed through at least one half of a thickness of the epitaxial semiconductor surface layer. The epitaxial semiconductor surface layer is thicker than a depth of the plurality of trenches. At least one capacitor dielectric layer lines a surface of the trenches. At least one trench fill layer on the dielectric layer fills the trenches.

20 Claims, 7 Drawing Sheets

(56) References Cited

U.S. PATENT DOCUMENTS

2017/0222041 A1 8/2017 Kawahara et al.
2018/0076277 A1 3/2018 Hu et al.

\* cited by examiner

INTEGRATED TRENCH CAPACITOR FORMED IN AN EPITAXIAL LAYER

CROSS REFERENCE TO RELATED APPLICATIONS

This application claims the benefit of Provisional Application Ser. No. 62/620,763 entitled "A New Method For High Quality And Density Capacitor Fabrication" filed Jan. 23, 2018, which is herein incorporated by reference in its entirety.

FIELD

This Disclosure relates to integrated trench capacitors as well as semiconductor devices including packaged devices that include integrated trench capacitors.

BACKGROUND

Integrated trench capacitors are known for high density capacitor designs. Formation of an integrated trench capacitor generally involves forming a deep trench type structure in a highly doped silicon substrate, lining the sidewalls and bottom of the trench with at least one dielectric layer, usually silicon oxide, followed by polysilicon filling of the trench that is doped in-situ or doped after the deposition, and then patterning of the polysilicon layer.

Capacitors and inductors formed on electric circuits including ICs are not ideal components because they do not have only capacitance or only inductance. However, they can be treated, to a good degree of approximation, as being ideal capacitors or ideal inductors in series with a resistance defined as being the equivalent series resistance (ESR).

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include integrated trench capacitors that can be on an integrated circuit (IC) with other circuitry or be a stand-alone (discrete) trench capacitors, that include at least one epitaxial semiconductor surface (ESS) layer on a semiconductor substrate having a doping level that is less than a doping level of the semiconductor substrate. A plurality of trenches are formed through at least one half of the thickness of the ESS layer. The ESS is thicker than a depth of the plurality of trenches. At least one capacitor dielectric layer lines surfaces of the trenches. At least one trench fill layer, such as doped polysilicon, is on the capacitor dielectric layer that fills the trenches.

BRIEF DESCRIPTION OF THE DRAWINGS

Reference will now be made to the accompanying drawings, which are not necessarily drawn to scale, wherein.

DETAILED DESCRIPTION

Figure 1:
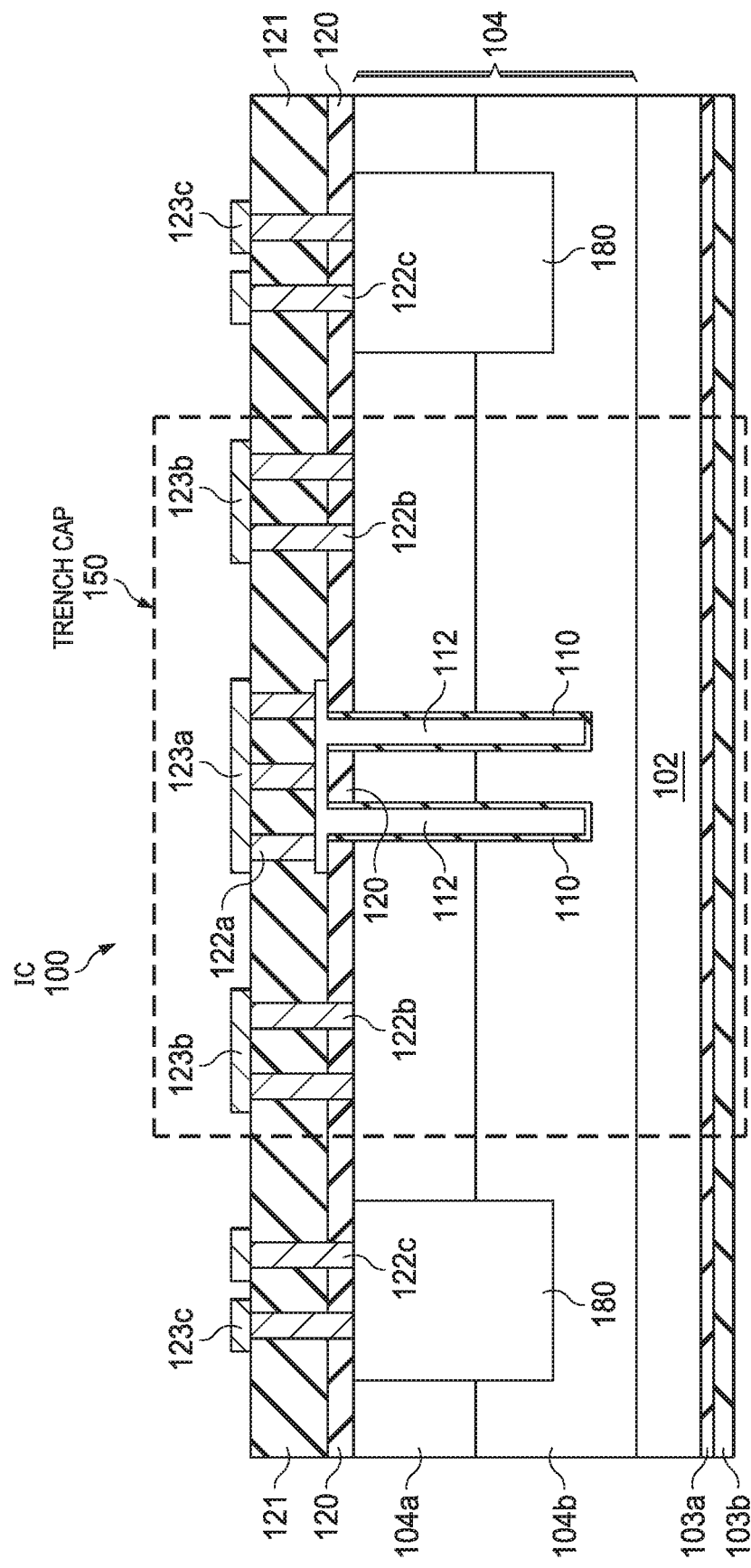
FIG. 1 is a cross sectional view of an example IC including a disclosed integrated trench capacitor, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed aspects recognize there is a challenge in designing integrated trench capacitors being the tradeoff between high quality capacitor dielectric layers, typically being thermally grown silicon oxide, and a desired low ESR. A low ESR generally needs a high substrate doping level, such as for n-doped substrates a phosphorous or arsenic doping concentration of at least about $8 \times 10^{19}/cm^3$ (Resistivity ~1 mohm·cm). However, it is recognized herein that a highly doped substrate can reduce the quality of the capacitor dielectric layer due to the high doping level which can cause a lattice distortion in the semiconductor crystal. Another associated risk of using a highly doped substrate is cross-contamination emanating from the top side of the substrate into the gate oxide furnace for a gate oxide growth step generally used for forming the capacitor dielectric layer for the trench capacitor, which may also be used for forming the gate dielectric for MOS devices.

FIG. 1 is a cross sectional view of an example IC 100 including a disclosed trench capacitor 150, according to an example aspect. Although shown on an IC 100, disclosed integrated trench capacitors can also be stand-alone (discrete) capacitors including tens of thousands or hundreds of thousands of trenches that are generally 10 to 50 µm deep depending the need for capacitance density, but is always less than the total ESS layer thickness, to provide a nF range capacitance, such as 10 to 50 nF. IC 100 is shown including functional circuitry 180 shown simply as blocks that includes metal 123c on filled vias 122c formed through a pre-metal dielectric (PMD) layer 121 for node contact.

The functional circuitry 180 can comprise circuit elements (including transistors, and generally diodes, resistors, capacitors, etc.) formed in at least one ESS layer shown as ESS layer 104a on ESS layer 104b on the bulk substrate 102, configured together with trench capacitor for generally realizing at least one circuit function, such as analog (e.g., (e.g., amplifier, power converter or power FET), RF, digital or memory function. The circuit function provided by the functional circuitry 180 can also be for providing a top side ground for the trench capacitor 150, so that the metal 123b and filled vias 122b shown in FIG. 1 would not be needed.

The total ESS layer thickness can be 20 to 60 microns, with a typical doping level of $2\times10^{16}$ to $5\times10^{17}$ cm$^{-3}$, but can be somewhat higher doped (e.g., 1 to $5\times10^{18}$ cm$^{-3}$) for a high Q trench capacitor. The substrate 102 and/or ESS layer(s) can comprise silicon, silicon germanium, or another semiconductor material. The substrate 102 generally is highly doped (n+ or p+) to limit the ESR, with a doping range from about $6\times10^{19}$ to $5\times10^{20}$ per cm$^3$ where the ESS layer(s) have a lower doping level relative to the substrate 102 generally reduced by at least a factor of 100, typically by a factor of at least 1,000.

For example, the ESS layers 104a and 104b can comprise a lightly p-type or n-type epitaxial layer that is grown on substrate 102 comprising a p+ substrate in the case of a p-type ESS layer or n+ substrate in the case of an n-type ESS layer. There can be multiple epitaxial layers with the same or different doping levels, which are all doped less than the doping level of the substrate. Although not shown in FIG. 1, as known in the art, the IC 100 generally includes field oxide such as shallow trench isolating (STI) or Local oxidation of silicon (LOCOS) in the epitaxial layer 104 for isolating adjacent devices. On the bottom side of the substrate 102 there are layers shown as 103a and 103b, that can comprise a backside polysilicon layer and a silicon oxide layer, respectively. These layers function as a sealant to prevent dopant from escaping out from the bottom side of the substrate 102 that can cause cross-contamination problems in processing equipment.

There is a capacitor dielectric layer 110 that can use the same thermally grown gate oxide furnace for growing a gate oxide layer for a MOS transistors on the IC that lines a surface of the plurality of trenches. The thickness range for the capacitor dielectric layer 110 is generally 100 to 500 Å, which will generally depend on the need for capacitance density and the power requirement. A capacitor dielectric layer 110 having a dielectric constant different (generally higher) as compared to silicon oxide can also be deposited.

The trenches include a trench fill layer 112 such as doped polysilicon on the capacitor dielectric layer 110 that fills the plurality of trenches. In the case of polysilicon, the polysilicon is generally doped to match the doping type of the ESS layers 104a, 104b and the substrate 102. The trench capacitor 150 is shown including a top side contacts to contact both the top plate (the trench fill layer 112) as well as to contact the bottom plate of the trench capacitor 150.

The contact to the integrated trench capacitor generally comprises metal filled vias formed through PMD layer 121, comprising metal 123a on filled vias 122a (e.g., W filled) to the trench fill layer 112 to provide top plate contact, and metal 123b on filled vias 122b that through the ESS layers 104a and 104b provides bottom plate contact. This contact arrangement is only one of at least two possible contact arrangements. A second contact arrangement has the top plate (the trench fill layer 112) connected to metal as shown in FIG. 1, but the contact to the bottom plate involves removing (e.g., by wafer backgrinding) off layers 103b and 103a, and then depositing backside metal (BSM) layer to the bottom side of the substrate 102 provide back side contact to the bottom plate to provide a solderable die attach metal stack to ensure good electrical contact to the chip (ohmic contact) or proper bonding of the chips to their mounting cases. The BSM layer can comprise gold or silver on titanium that is on nickel.

The aspect ratio (AR) for disclosed trench capacitors generally depends on the design need, but for a high density trench capacitor, the aspect ratio is in general over 10. For example, the AR value can be from 18 to 30.

Figure 2A:
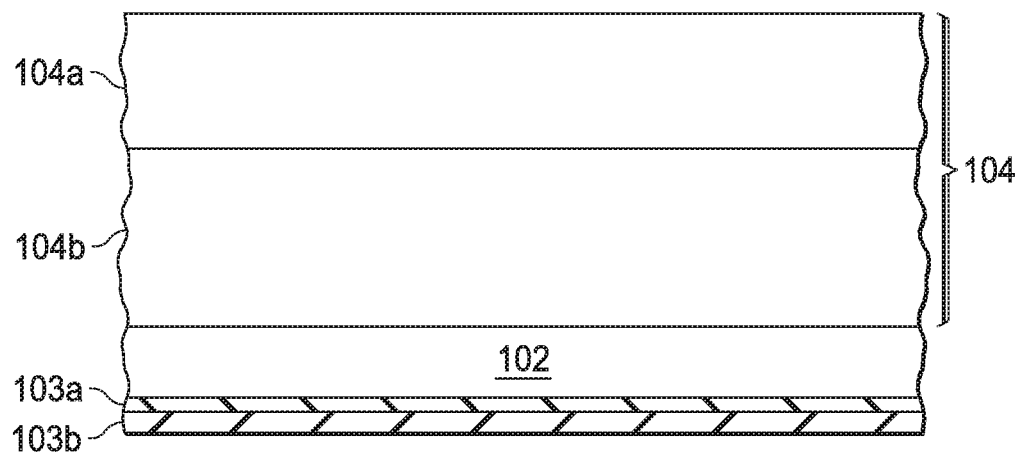
FIGS. 2A-2I are cross-sectional diagrams showing processing progression for an example method of forming an integrated trench capacitor, according to an example aspect.

FIGS. 2A-2J are cross-sectional diagrams showing processing progression for an example method of forming a disclosed integrated trench capacitor. FIG. 2A shows ESS layers 104a on 104b on a bulk substrate material 102. The ESS layer(s) can be deposited using a conventional epitaxial deposition or an atomic layer deposition (ALD) which is a specialized form of epitaxy that typically deposits alternating monolayers of two elements onto a substrate. The thickness and resistivity for the ESS layer(s) is generally based on the device performance desired, and as described above the ESS layer thickness is greater than the trench depth. On the bottom side of the substrate 102 there are layers shown as 103a and 103b that can comprise a backside polysilicon layer and a silicon oxide layer, respectively.

Figure 2B:
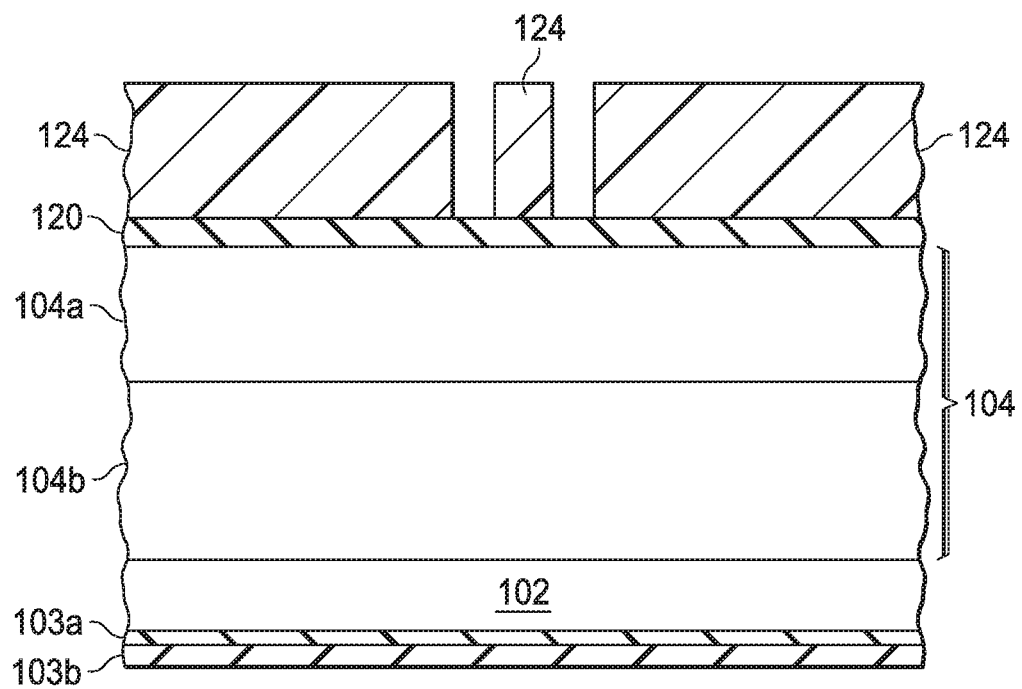

FIG. 2B shows an overlying photoresist layer 124 created and patterned so that trenches in the ESS layers 104a, 104b can be formed. For purposes of illustration, only two deep trenches 111 are shown formed in FIG. 2B, but it is understood more than 2 trenches (such as tens of thousands or hundreds of thousands of trenches) are generally formed. The depth of the trenches 111 is generally at least 15 microns depending the need for capacitance density, but as noted above is less than the total ESS layer 104a, 104b thickness. The photoresist layer 124 overlies a dielectric layer 120 that is generally a silicon oxide layer 120 on the ESS layer 104a that protects the surface of the trench capacitor or the IC. Although not shown, the photoresist layer 124 can be on top of a hardmask (HM) layer, such as a high-density plasma (HDP) oxide HM layer, that is formed on the dielectric layer 120. An oxide HM layer may be used when the photoresist layer 124 is thin or the trench is deep enough so that the photoresist layer 124 would be completely destroyed in the trench etching process.

Figure 2C:
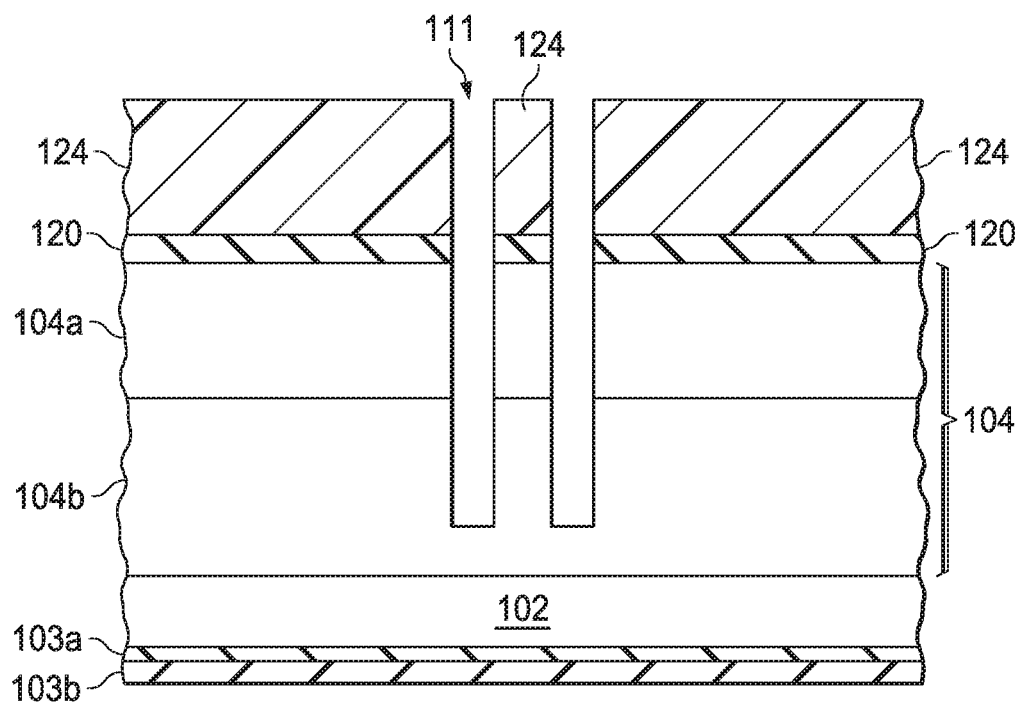

FIG. 2C shows the in-process trench capacitor after anisotropic etching used to form deep trenches 111 through the dielectric layer 120, and into the ESS layer 104b, but not reaching the top of the substrate 102, so that bottom of the trenches are above the top of the semiconductor substrate 102. It will be understood that although photoresist layer 124 is shown here as remaining intact after the trench etching, much of the photoresist layer 124 may have been removed by the trench etch process.

In at least one embodiment, a circular trench layout is used which eliminates sharp corners, and the width of the trenches is approximately 0.5 µm to 3 µm and the trenches are spaced apart approximately 0.3 µm to 1.5 µm. The trench 111 depth can be deeper or shallower as required by the application and to fit within the parameters of the process into which the capacitor is being integrated, e.g., the thickness of the ESS layers 104a and 104b and the drive conditions for any wells. The photoresist layer 124 is then removed and the wafer is cleaned.

Figure 2D:
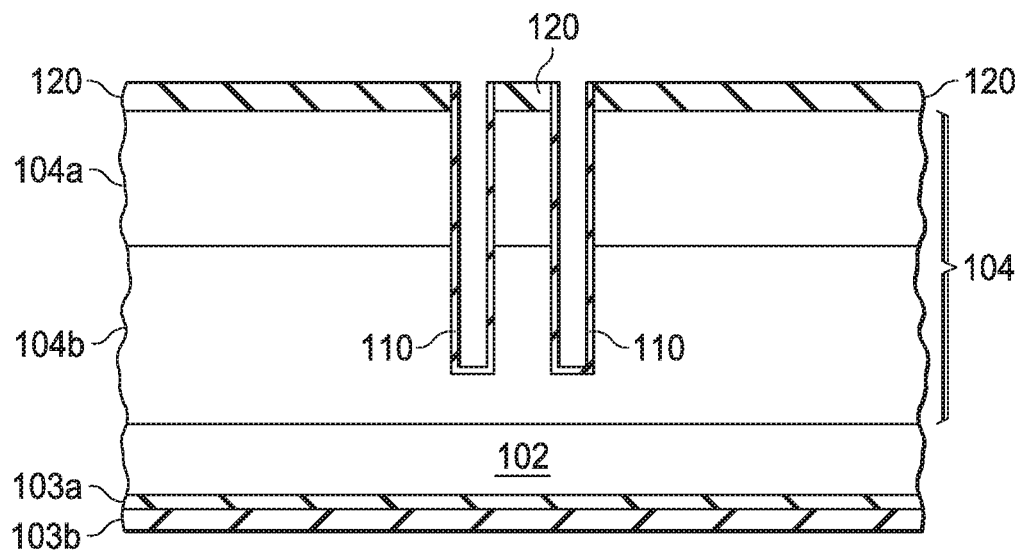

In FIG. 2D the capacitor dielectric layer 110 shown is grown or deposited on the sidewalls and the bottom surfaces of the trenches 111. In one embodiment, the capacitor dielectric layer 110 is a single layer that comprises silicon oxide. In another embodiment, the capacitor dielectric layer 110 comprises two or more dielectric layer. The silicon oxide layer can be, for example, 200 Å to 2,000 Å thick, such as 500 Å thick for an operating voltage of about 13.2 V. As noted above, the capacitor dielectric layer 110 may also be deposited. In one particular embodiment, the capacitor dielectric layer 110 comprises an Oxide-Nitride-Oxide (ONO) layer stack.

Figure 2E:
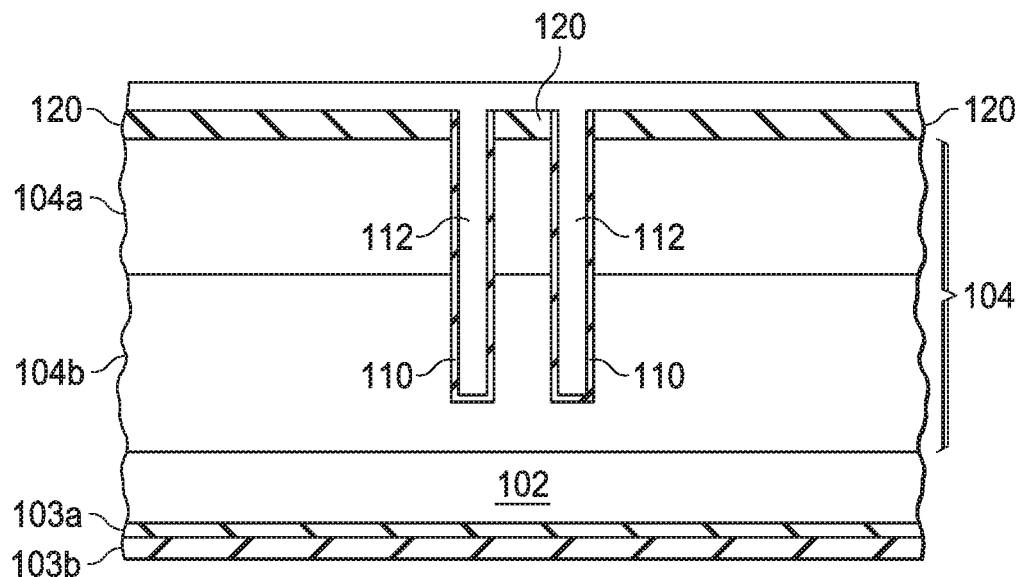

FIG. 2E shows the in-process trench capacitor after a trench fill material 112 is deposited, generally by an LPCVD process to fill and overfill the trenches 111 which involves a deposited thickness of >½ of the trench width. When the trench fill layer comprises polysilicon, the polysilicon layer can be doped in situ or as a separate later doping step. For example, the polysilicon doping level can be between $5 \times 10^{18}/cm^3$ to $1 \times 10^{20}/cm^3$. Other trench fill materials can also be used including other electrically conductive materials, such as a metal or metal compound, for example Ti, TiN, or TaN.

Figure 2F:
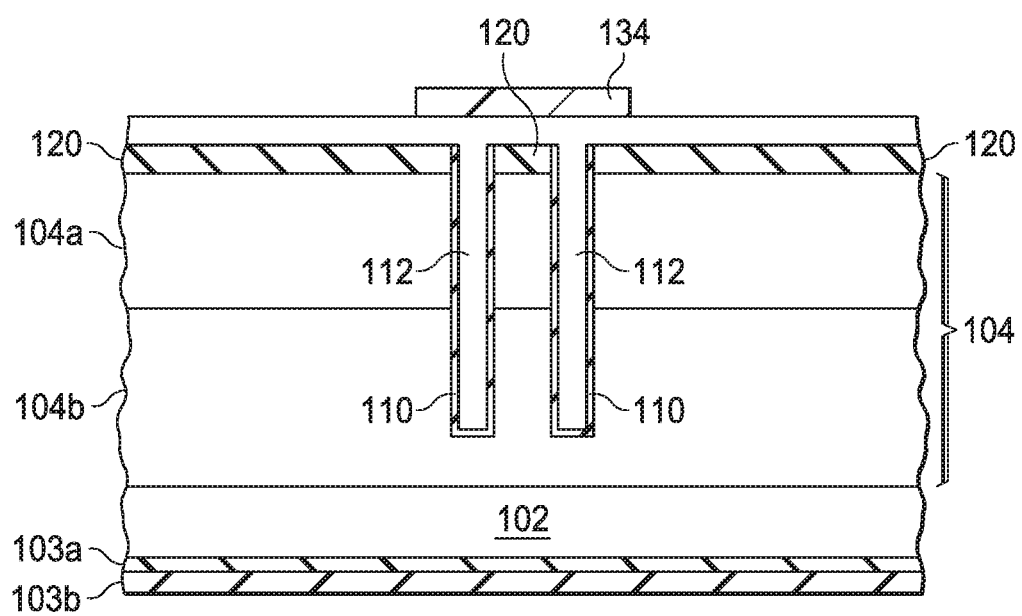
Figure 2G:
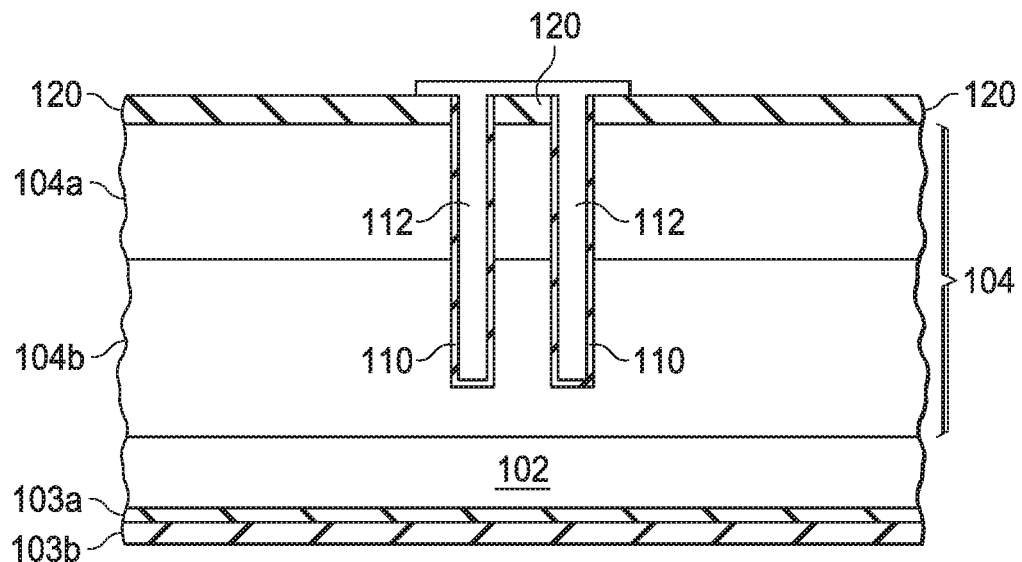

FIG. 2F shows the in-process trench capacitor after an overlying photoresist layer 134 is created and patterned so that the trench fill material 112 can be patterned. FIG. 2G shows the in-process trench capacitor after patterning of the trench fill material 112. The trench fill material 112 is generally also removed from the back side of the substrate 102 while removing trench fill material from the front side.

Figure 2H:
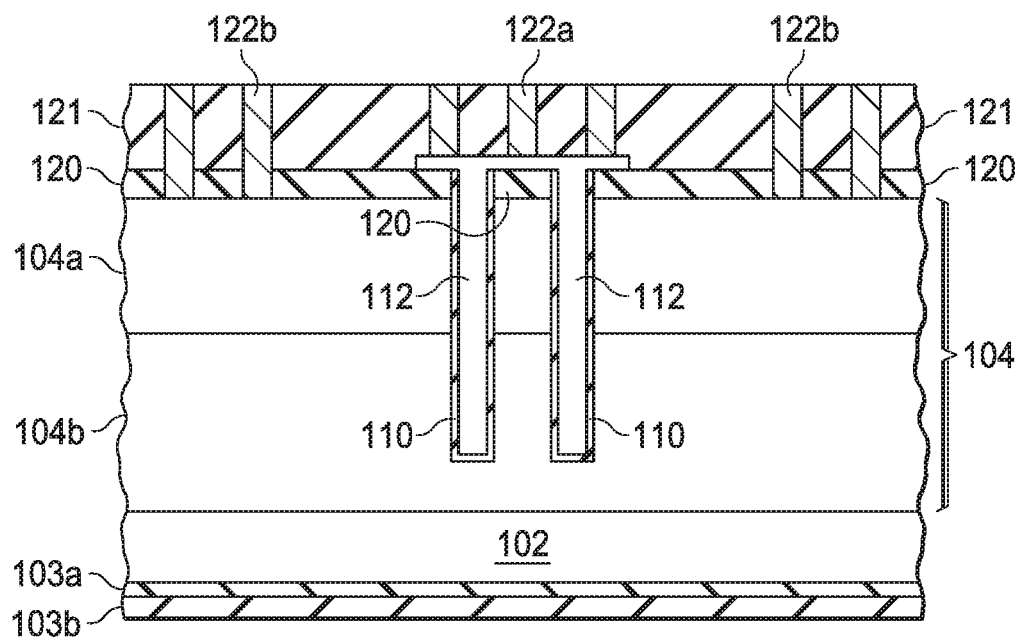

FIG. 2H shows the in-process trench capacitor after depositing a PMD layer 121 on the patterned trench fill material 112 and on the dielectric layer 120 lateral to the patterned trench fill layer on the surface of ESS layer 104a. The PMD layer 121 can comprise a tetraethoxysilane (TEOS)-derived silicon oxide layer. A TEOS deposition for a non-plasma deposition process can comprise low pressure CVD (LPCVD) at a pressure of about 300 mTorr and at a temperature of about 700° C. However, other dielectric layers can also be used for the PMD layer 121 including deposited silicon oxides, such as comprising an organosilicate glass (OSG), a low-k dielectric (i.e., a smaller dielectric constant relative to silicon dioxide), a doped dielectric layer such as a fluorine-doped silica glass (FSG), or a SiN layer or its variants (e.g., SiON). The thickness range for the PMD layer 121 is generally from 6,000 A to 8,000 A.

Figure 2I:
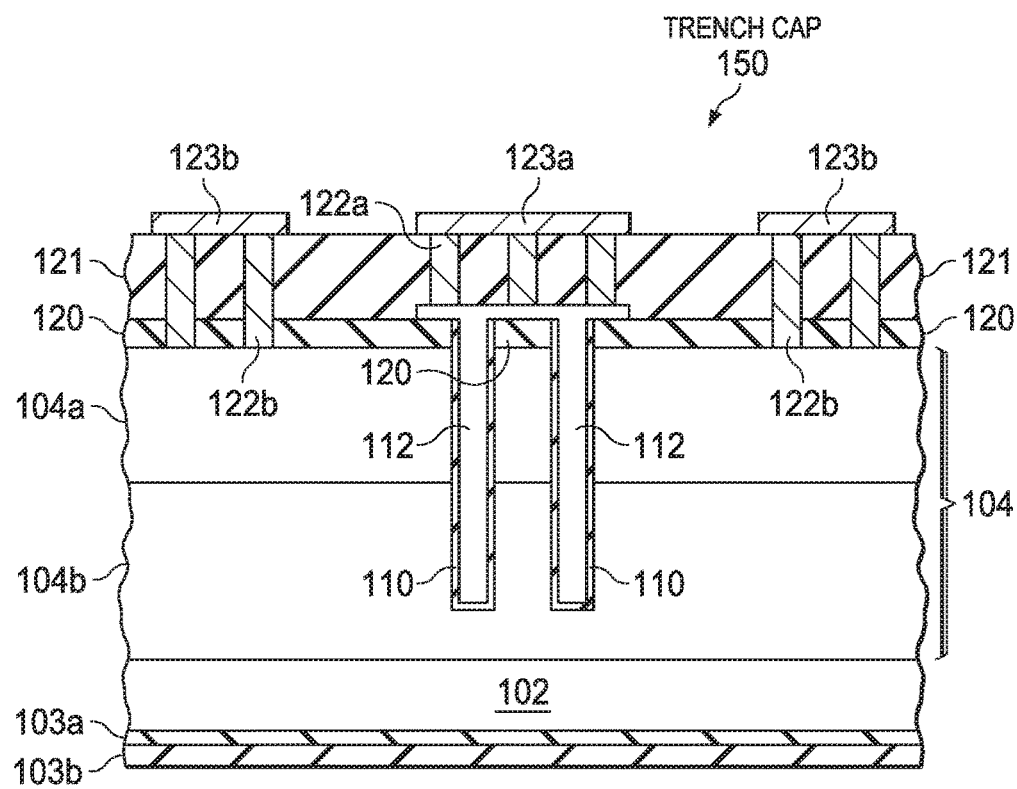

FIG. 2I shows the in-process trench capacitor after forming filled contact vias in the PMD layer 121, depositing a metal layer over the PMD layer 121, and then patterning the metal layer to form metal 123a over filled vias 122a over the trench fill material 112 to contact the top plate of the trench capacitor, and metal 123b over filled vias 122b to the ESS layer 104a to provide contact to the bottom plate of the trench capacitor. The metal layer can comprise AlCu, typically with 0.5 to 4 wt. % Cu. Alternatively, the metal layer can comprise only copper in which case a damascene process is generally performed. One or more metal levels may follow, followed by passivation processing to expose bond pads in the top metal layer.

Figure 3B:
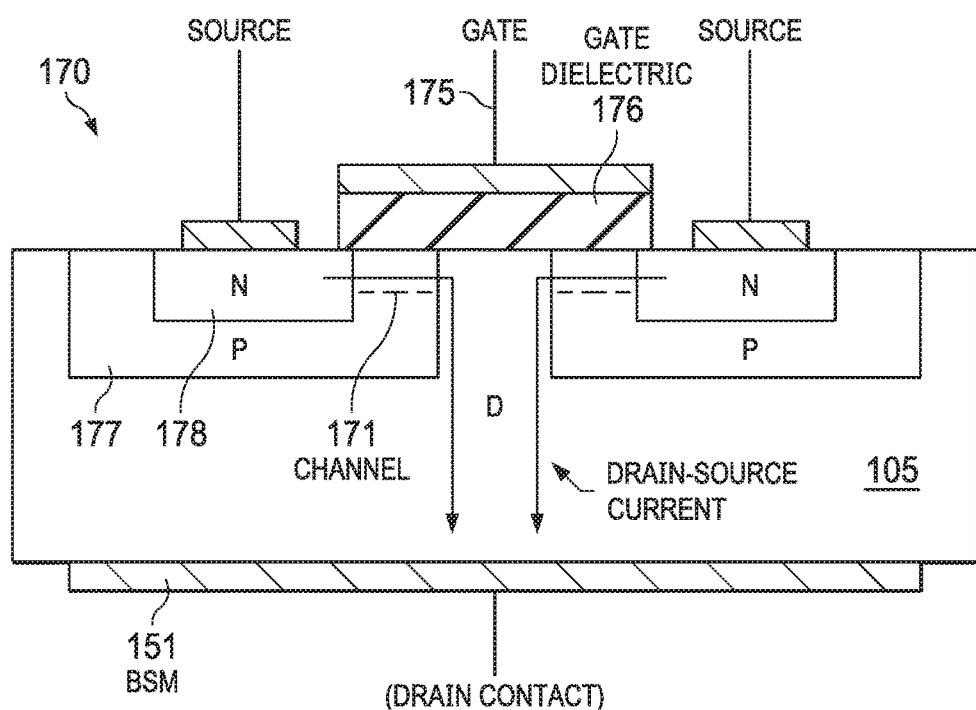
FIG. 3B shows an example simplified example vertical metal oxide semiconductor FET (MOSFET) shown as a cross section depiction that can be used for the vertical FET in disclosed packaged devices.
Figure 3A:
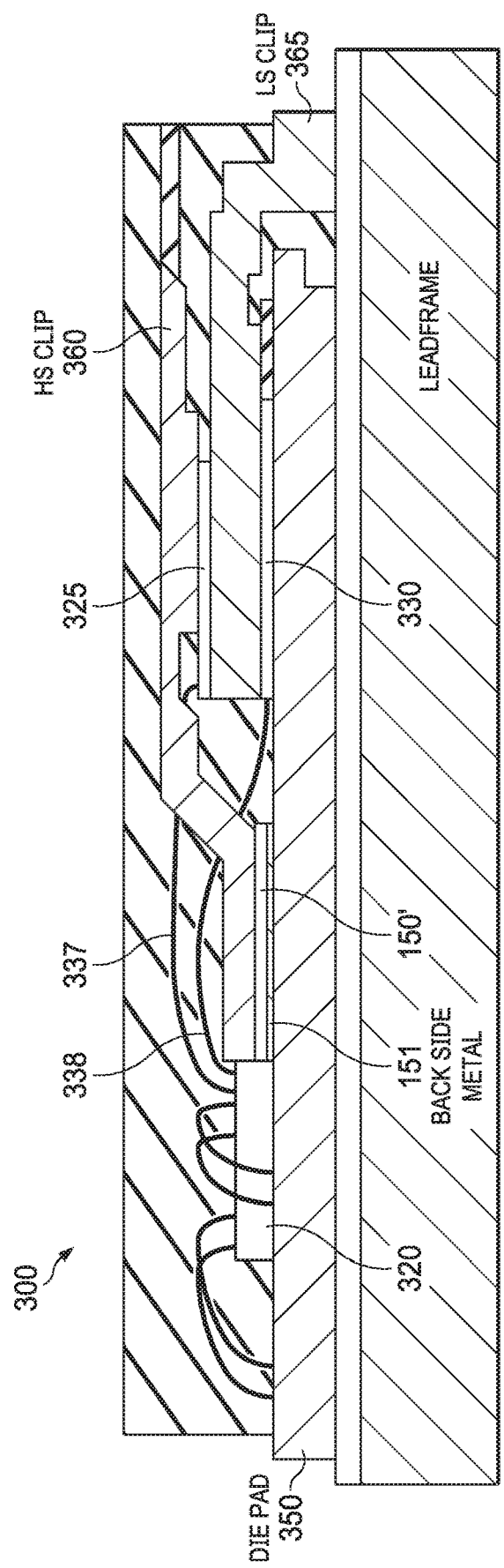
FIG. 3A shows an example packaged device comprising a synchronous buck converter including a disclosed trench capacitor in a package along with a controller IC and stacked vertical field effect transistors (FETs), all shown on a common die pad.

FIG. 3A shows an example packaged device 300 comprising an example synchronous buck converter including a disclosed trench capacitor shown as 150' in a package along with a controller IC 320 that generally also includes integrated gate drivers, and stacked vertical FETs including a stacked high-side (HS) vertical FET 325 on a low-side (LS) vertical FET 330 all on die pad 350 of a lead frame. The trench capacitor 150' is shown including a back side metal (BSM) layer 151 that provides bottom plate contact which is an alternative to the front side bottom plate contact provided by the metal 123b over filled vias 122b. Otherwise trench capacitor 150' is the same structures as trench capacitor 150 shown in FIG. 1 and in FIG. 2I. There are metal clips shown including a HS clip 360 on the HS vertical FET 325, and a LS clip 365 between the HS FET 325 and the LS FET 330. The high-current VIN (high-side FET 325 drain) and voltage switching (VSW) connections use clip-bonding technology, which replaces the wire-bond connection with generally a solid copper bridge. This arrangement substantially reduces the on-resistance $R_{DS}$ (ON) and conduction losses compared to wire bonding, and generally provides excellent thermal performance.

The trench capacitor 150' is lateral to the FET stack and the controller IC 320 on the same die pad 350. The bond wires shown include bond wires 337 and 338 from the controller IC 320 are to bond pads that coupled to respective gates of the HS FET 325 and the LS FET 330. In a synchronous buck converter such as packaged device 300, the FET's 325 and 330 vertical current flow makes it ideal for stacking. For NMOS FETs the HS FET 325 source terminal is located directly above the LS FET 330 drain terminal, virtually eliminating resistance and parasitic inductance between these devices for enabling faster switching. In addition, the LS FET 330 source terminal is at ground potential and with a suitable BSM layer can be soldered directly to the exposed pad of the package for highly efficient heat transfer.

FIG. 3B shows a simplified example vertical MOSFET 170 shown as a cross section depiction that can be used for the MOSFET in disclosed packaged devices. Although shown as a planar gate device, trench gate MOSFETs may also be used. The actual structures of a real power MOSFET is generally more complex and includes a variety of other structures including trenches, such as for the gate or for field plates. The vertical MOSFET 170 includes an N+ source 178 formed in a pwell 177 that is formed in a substrate 105.

The drain for the MOSFET device 170 shown as D is from the center region under the gate electrode 175 on a gate dielectric 176 to the bottom of the die having a BSM layer 151 thereon. The channel 171 shown is horizontal under the gate electrode 175 on gate dielectric 176, but it is shorter as compared to a conventional MOSFET, and the current flow shown between the channel 171 and the drain contact at the BSM layer 111 is vertical. The short channel 171 provided means a low ON resistance, a property of power devices.

As described above, disclosed trench capacitors divide the structure of a high density trench capacitor into two portions. The first portion (on top of the trench capacitor) comprises one or more ESS layers with a doping concentration sufficiently low and a thickness designed to meet the requirements of a high quality capacitor dielectric structure, and the second portion (on the bottom of the trench capacitor) is a semiconductor bulk material with a higher doping concentration as compared to the ESS layer(s) to meet ESR needs.

Disclosed trench capacitors can be packaged with IC chips as their input and output filtering network, or as a discrete high density capacitor. The semiconductor die with disclosed trench capacitors may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other aspects are possible within the scope of the claimed invention, and further additions, deletions, substitutions and modifications may be made to the described aspects without departing from the scope of this Disclosure.

The invention claimed is:

1. A trench capacitor, comprising:
   at least one epitaxial semiconductor surface layer on a semiconductor substrate having a doping level that is less than a doping level of the semiconductor substrate;
   a plurality of trenches through at least one half of a thickness of the epitaxial semiconductor surface layer, wherein the epitaxial semiconductor surface layer is thicker than a depth of the plurality of trenches;
   at least one capacitor dielectric layer that lines a surface of the plurality of trenches, and
   at least one trench fill layer on the capacitor dielectric layer that fills the plurality of trenches, the at least one trench fill layer including first and second trench fill layers connected by a conductive bridge that extends laterally over a top surface of the at least one epitaxial semiconductor surface layer.

2. The trench capacitor of claim 1, wherein the at least one trench fill layer comprises doped polysilicon.

3. The trench capacitor of claim 1, further comprising a back side metal layer on a bottom side of the semiconductor substrate.

4. The trench capacitor of claim 1, wherein the at least one epitaxial semiconductor surface layer comprises a second epitaxial semiconductor surface layer on a first epitaxial semiconductor surface layer.

5. The trench capacitor of claim 1, wherein the capacitor dielectric layer comprises a thermal oxide layer.

6. The trench capacitor of claim 1, wherein the depth of the plurality of trenches is 10 μm to 50 μm.

7. A packaged semiconductor device, comprising:
   a leadframe including at least one die pad; at least a first power transistor die on the die pad; and a second die comprising a trench capacitor on the die pad, the trench capacitor comprising:
   at least one epitaxial semiconductor surface layer on a semiconductor substrate having a doping level that is less than doping level of the semiconductor substrate;
   a plurality of trenches through at least one half of a thickness of the epitaxial semiconductor surface layer, wherein the epitaxial semiconductor surface layer is thicker than a depth of the plurality of trenches;
   at least one capacitor dielectric layer that lines a surface of the plurality of trenches, and
   at least one trench fill layer on the capacitor dielectric layer that fills the plurality of trenches, the at least one trench fill layer including first and second trench fill layers connected by a conductive bridge that extends laterally over a top surface of the at least one epitaxial semiconductor surface layer.

8. The packaged semiconductor device of claim 7, wherein the trench fill layer and the conductive bridge comprise doped polysilicon.

9. The packaged semiconductor device of claim 7, wherein the first power transistor die comprises stacked metal oxide semiconductor field effect transistor (MOSFET) devices, and wherein the packaged semiconductor device comprises a Quad Flat No-lead (QFN) package.

10. The packaged semiconductor device of claim 7, wherein the at least one epitaxial semiconductor surface layer comprises a second epitaxial semiconductor surface layer on a first epitaxial semiconductor surface layer.

11. The packaged semiconductor device of claim 7, wherein the depth of the plurality of trenches is 10 μm to 50 μm.

12. The trench capacitor of claim 1, wherein the conductive bridge comprises a same material layer as the first and second trench fill layers.

13. The trench capacitor of claim 1, further comprising a second dielectric layer over the conductive bridge, a metal contact over the second dielectric layer, and a via connection through the second dielectric layer that conductively connects the metal contact to the conductive bridge.

14. The trench capacitor of claim 1, further comprising a second dielectric layer over the conductive bridge, a metal contact over the second dielectric layer, and a via connection through the second dielectric layer that conductively connects the metal contact to the at least one epitaxial semiconductor surface layer.

15. The trench capacitor of claim 7, wherein the conductive bridge comprises a same material layer as the first and second trench fill layers.

16. The trench capacitor of claim 7, further comprising a second dielectric layer over the conductive bridge, a metal contact over the second dielectric layer, and a via connection through the second dielectric layer that conductively connects the metal contact to the conductive bridge.

17. The trench capacitor of claim 7, further comprising a second dielectric layer over the conductive bridge, a metal contact over the second dielectric layer, and a via connection through the second dielectric layer that conductively connects the metal contact to the at least one epitaxial semiconductor surface layer.

18. An integrated circuit, comprising:
   an epitaxial semiconductor surface layer located on a semiconductor substrate and having a doping level that is less than a doping level of the semiconductor substrate;
   first and second trenches extending through at least one half of a thickness of the epitaxial semiconductor surface layer, wherein the epitaxial semiconductor surface layer is thicker than a depth of the at least one trench;
   a dielectric liner that lines sidewalls and bottoms of the trenches, and
   first and second trench fill layers respectively filling the first and second trenches and connected by a conductive bridge that extends laterally over a top surface of the at least one epitaxial semiconductor surface layer.

19. The integrated circuit of claim 18, further comprising a dielectric layer over the conductive bridge, a metal contact over the dielectric layer, and a via connection through the dielectric layer that conductively connects the metal contact to the conductive bridge.

20. The trench capacitor of claim 18, further comprising functional circuitry formed over or in the epitaxial semiconductor surface.

* * * * *